(12) United States Patent
Srinivasa et al.

(10) Patent No.: US 11,688,444 B2
(45) Date of Patent: Jun. 27, 2023

(54) WORDLINE DRIVER ARCHITECTURE

(71) Applicant: Arm Limited, Cambridge (GB)

(72) Inventors: Akash Bangalore Srinivasa, Bangalore (IN); Andy Wangkun Chen, Austin, TX (US); Yew Keong Chong, Austin, TX (US); Sreebin Sreedhar, Bangalore (IN); Balaji Ravikumar, Bangalore (IN); Penaka Phani Goberu, Bangalore (IN); Vibin Vincent, Bangalore (IN)

(73) Assignee: Arm Limited, Cambridge (GB)

( * ) Notice: Subject to any disclaimer, the term of this patent is extended or adjusted under 35 U.S.C. 154(b) by 32 days.

(21) Appl. No.: 17/209,876

(22) Filed: Mar. 23, 2021

(65) Prior Publication Data
US 2022/0310144 A1 Sep. 29, 2022

(51) Int. Cl.
*G11C 8/08* (2006.01)
*G11C 11/16* (2006.01)
*G11C 11/418* (2006.01)

(52) U.S. Cl.
CPC ............ *G11C 8/08* (2013.01); *G11C 11/1657* (2013.01); *G11C 11/418* (2013.01)

(58) Field of Classification Search
CPC ...... G11C 8/08; G11C 11/1657; G11C 11/418
USPC .................................................... 365/230.06
See application file for complete search history.

(56) References Cited

U.S. PATENT DOCUMENTS

| | | | |
|---|---|---|---|
| 5,598,118 A * | 1/1997 | Koifman | G11C 27/024 327/108 |
| 11,049,555 B1 * | 6/2021 | Tsai | G11C 7/12 |
| 2005/0094474 A1 * | 5/2005 | Deng | G11C 5/14 365/228 |
| 2005/0128852 A1 * | 6/2005 | Deng | G11C 7/22 365/226 |
| 2007/0030741 A1 * | 2/2007 | Nii | G11C 5/14 365/189.11 |
| 2009/0196115 A1 * | 8/2009 | Agari | G11C 11/417 365/230.06 |
| 2011/0199837 A1 * | 8/2011 | Reohr | G11C 11/4085 365/189.11 |
| 2013/0328591 A1 * | 12/2013 | Chen | H03K 19/094 326/83 |
| 2014/0002049 A1 * | 1/2014 | Schrom | H02M 3/1588 323/311 |
| 2016/0035397 A1 * | 2/2016 | Pilo | G11C 11/417 365/154 |
| 2019/0164590 A1 * | 5/2019 | Chanana | G11C 11/419 |
| 2021/0057009 A1 * | 2/2021 | Kim | G11C 8/08 |
| 2022/0028449 A1 * | 1/2022 | Gupta | G11C 5/148 |

* cited by examiner

*Primary Examiner* — Ly D Pham
(74) *Attorney, Agent, or Firm* — Pramudji Law Group PLLC; Ari Pramudji

(57) ABSTRACT

Various implementations described herein are directed to a device having first circuitry with wordline drivers coupled to wordlines. The device may have second circuitry with switch structures that are coupled between a first voltage and ground. The switch structures may be configured to provide a second voltage to a power connection of each wordline driver based on the first voltage.

20 Claims, 4 Drawing Sheets

WORDLINE DRIVER ARCHITECTURE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some modern circuit designs, conventional memory devices may use NMOS clamps on internal voltage nets that typically develop inefficiencies with respect to area, spatial random variation, and also variation across instances with different rows-per-bitline (RPB). Also, these inefficiencies may also refer to other similar lowering across processes that reduce writability standards with respect to wordline underdrive behaviors and various other related characteristics. Thus, there exists a need to improve physical circuit designs for clamping internal voltage nets in various memory related applications.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to wordline underdrive schemes and techniques for various memory related applications in physical circuit layout designs. Also, the various schemes and techniques described herein may provide various robust distributed wordline underdrive architecture so as to provide lower variation across processes for improved random variation. For instance, due to the distributed architecture of the novel design, row variation across memory may be reduced along with less IR drop and improved performance, and in addition, read stability and writability may also improve due to process adaptiveness. The wordline underdrive schemes and techniques may be used in memory architecture that may refer to various volatile memory and/or non-volatile memory, such as, e.g., static random access memory (SRAM). The memory architecture may include memory circuitry with an array of bitcells that are accessible via data access lines, such as, e.g., one or more wordlines and bitlines.

Various implementations of wordline underdrive schemes and techniques for memory applications will be described herein with reference to FIGS. 1-3.

Figure 1:
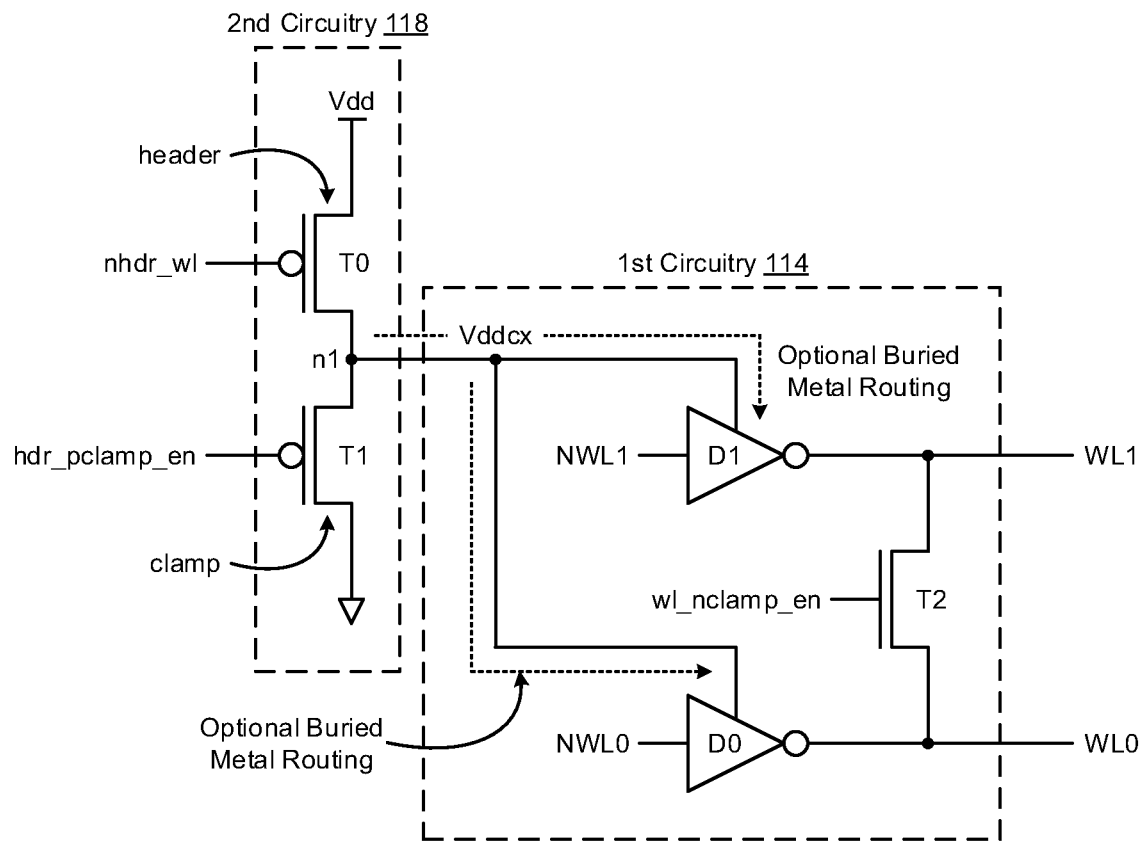
FIG. 1 illustrates a schematic diagram of wordline underdrive architecture in accordance with various implementations described herein.

FIG. 1 illustrates a schematic diagram 100 of wordline underdrive architecture 104 in accordance with various implementations described herein.

In various implementations, the wordline underdrive architecture 104 may be implemented as a system or device having various integrated circuit (IC) components that are arranged and coupled together as an assemblage or combination of parts that provide for physical circuit designs and various related structures. In some instances, a method of designing, building, fabricating and manufacturing the wordline underdrive architecture 104 as an integrated system or device may involve use of various IC circuit components described herein to thereby implement the wordline underdrive schemes and techniques associated therewith. Further, the wordline underdrive architecture 104 may be integrated with computing circuitry and related components on a single chip, and also, the wordline underdrive architecture 104 may be implemented in embedded systems for automotive, electronic, mobile, server and Internet-of-things (IoT) applications.

As shown in FIG. 1, the wordline underdrive (WLUD) architecture 104 may include various circuitry and/or components including, e.g., first circuitry 114 and second circuitry 118. The first circuitry 114 may include wordline drivers (D0, D1) that are coupled to wordlines (WL0, WL1). The second circuitry 118 may have switch structures (T0, T1) that are coupled between a first voltage (Vdd) and ground (Vss or Gnd), and the switch structures (T0, T1) may be configured to provide a second voltage (Vddcx) to the power connection of each wordline driver (D0, D1) based on the first voltage (Vdd). In some implementations, the switch structures (T0, T1) may refer to P-type transistors that are coupled in series between the first voltage (Vdd) and ground (Vss or Gnd). However, in other instances, N-type transistors may be used to achieve similar results and/or similar behavior. Further, the first voltage (Vdd) may refer to a source supply voltage, and also, the second voltage (Vddcx) may refer to an internal supply voltage.

In some implementations, the first circuitry 114 may refer to driver circuitry, such as, e.g., worldline driver (WLD) circuitry, and also, the wordlines (WL0, WL1) may refer to a first wordline (WL0) and a second wordline (WL1). Also, the wordline drivers (D0, D1) may include a first wordline driver (D0) coupled to the first wordline (WL0) and a second wordline driver (D1) coupled to the second wordline (WL1). Also, in some instances, the first circuitry 114 may include a transistor (T2) coupled between the first wordline (WL0) and the second wordline (WL1), and also, the transistor (T2) may be configured to pass wordline voltage signals between the first wordline (WL0) and the second wordline (WL1) when activated. Also, the transistor (T2) may refer to an N-type transistor coupled to the wordlines (WL0, WL1) after the wordline drivers (D0, D1). However, in other instances, a P-type transistor may be used to achieve similar results and/or similar behavior. Also, in some instances, the first wordline driver (D0) receives a complementary wordline voltage signal (NWL0) and then provide the wordline voltage signal (WL0) as output to the first wordline (WL0). Further, in some instances, the second wordline driver (D1) may receive a complementary wordline voltage signal (NWL1) and then provide the wordline voltage signal (WL1) as output to the second wordline (WL1).

In some implementations, the second circuitry 118 may refer to clamp circuitry, and the switch structures (T0, T1)

may include a first P-type transistor (T0) and a second P-type transistor (T1). Also, as shown in FIG. 1, the first P-type transistor (T0) may be coupled between the first voltage (Vdd) and the second P-type transistor (T1) so as to operate as a header, and the second P-type transistor (T1) may be coupled between the first P-type transistor (T0) and ground (Vss or Gnd) so as to operate as a clamp. Further, the first P-type transistor (T0) may be coupled to the second P-type transistor (T1) at an output node (n1) of the second circuitry 118. In some instances, the output node (n1) may provide the second voltage (Vddcx) to the power connection of each wordline driver (D0, D1) when the first P-type transistor (T0) is activated and/or when the second P-type transistor (T1) is deactivated.

In some implementations, the first transistor (T0) may be activated (or enabled) with a wordline header signal (nhdr_wl) that is applied to a gate of the first transistor (T0), and also, the second transistor (T1) may be activated (or enabled) with a header-clamping signal (hdr_pclamp_en) that is applied to a gate of the second transistor (T1). In some instances, when activated, the first transistor (T0) may pass the first voltage (Vdd) to the internal node (n1). Also, when deactivated, the second transistor (T1) may operate as a clamp so as to allow the first voltage (Vdd) to pass through the internal (n1) as the internal voltage (Vddcx) to power connections of the wordline drivers (D0, D1). Otherwise, when activated, the second transistor (T1) operates as an open clamp that allows the internal voltage (Vddcx) to pass from the internal node (n1) to ground (Vss or Gnd).

In some implementations, the wordline underdrive architecture 104 may include a backside power distribution network (BPDN) having buried power rails for distribution of power, voltage, current, or other critical signal nets between components. For instance, the wordline underdrive architecture 104 may include one or more buried conductive lines that are routed between the output node (n1) of the second circuitry 118 and the power connections of the wordline drivers (D0, D1). In various instances, the one or more buried conductive lines may refer to buried power rails (or buried signal lines) that provide for optional metal routing of the internal voltage (Vddcx) from the output node (n1) of the second circuitry 118 to the power connections of the wordline drivers (D0, D1) of the first circuitry 114.

Figure 2:
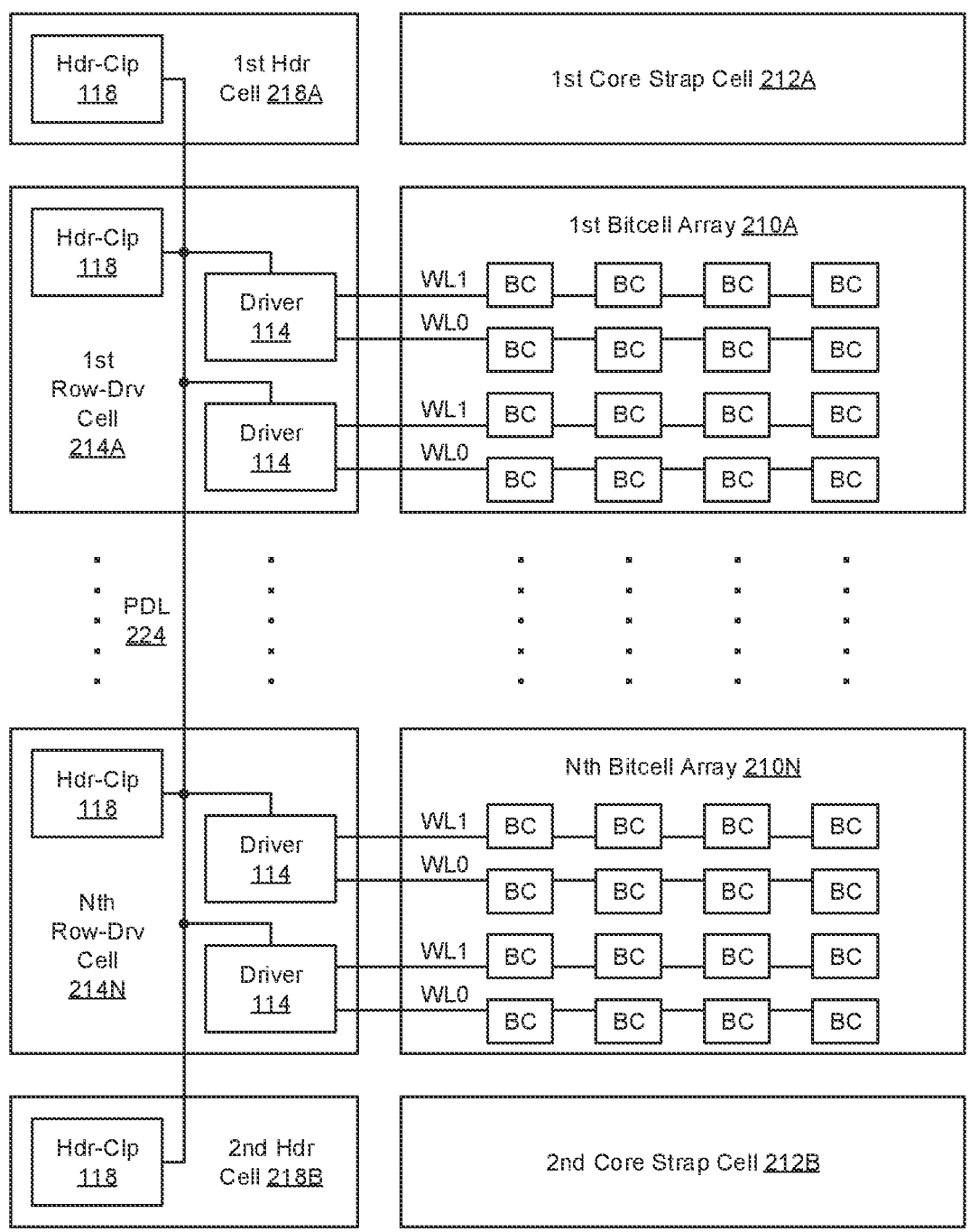
FIG. 2 illustrates a schematic diagram of memory architecture in accordance with various implementations described herein.

FIG. 2 illustrates a diagram 200 of memory architecture 204 in accordance with various implementations described herein.

In various implementations, the memory architecture 204 may be implemented as a system or device having various integrated circuit (IC) components that are arranged and coupled together as an assemblage or combination of parts that provide for physical circuit designs and various related structures. In some instances, a method of designing, building, fabricating and/or manufacturing the memory architecture 204 as an integrated system or device may involve use of the various IC circuitry and/or components described herein so as to implement various wordline underdrive (WLUD) schemes and techniques associated therewith. Further, the memory architecture 204 may also be integrated with computing circuitry and related components on a single chip, and the memory architecture 204 may be implemented in embedded systems for automotive, electronic, mobile, server and Internet-of-things (IoT) applications, including remote sensor nodes.

In some implementations, as shown in FIG. 2, the memory architecture 204 may have distributed wordline driver architecture. For instance, the memory architecture 204 may include multiple header cells 218A, 218B along with header-clamp circuitry (Hdr-Clp) 118, and further, the memory architecture 204 may also include multiple row driver cells (Row-Drv) 214A, . . . , 214N along with wordline driver circuitry 114 and header-clamp circuitry (Hdr-Clp) 118. Also, the header-clamp circuitry (Hdr-Clp) 118 in FIG. 2 may be configured in a similar manner as the second circuitry 118 in FIG. 1, and in addition, the wordline driver circuitry 114 in FIG. 2 may be configured in a similar manner as the first circuitry 114 in FIG. 1.

The multiple header cells 218A, 218B may include a first header cell 218A and a second header cell 218B. In some instances, the first header cell 218A may include the header-clamp circuitry (Hdr-Clp) 118, and also, the second header cell 218B may include the header-clamp circuitry (Hdr-Clp) 118. As shown in FIG. 2, the header-clamp (Hdr-Clp) 118 may be coupled to a power distribution line (PDL) 224, wherein the header-clamp circuitry (Hdr-Clp) 118 may have a first set of transistors (e.g., T0, T1 in FIG. 1) that are coupled between the source voltage (Vdd) and ground (Vss or Gnd), and wherein the first set of transistors (T0, T1) are configured to provide the first internal voltage (Vddcx) to the power distribution line (PDL) 224 based on the source voltage (Vdd). Also, as shown in FIG. 2, the second header cell 218B may include the header-clamp circuitry (Hdr-Clp) 118 configured in a similar manner as the first header cell 218A.

In various implementations, in reference to the first header cell 218A, the first set of transistors (T0, T1) may refer to first P-type transistors that are coupled in series between the source voltage (Vdd) and ground (Vss or Gnd), and the first P-type transistors may be configured to provide the first internal voltage (Vddcx) to the power distribution line (PDL) 224 via the node (n1) disposed between the first P-type transistors. Also, the second header cell 218B may be configured similarly with another set of transistors in a manner as described in reference to the first header cell 218A.

The multiple row driver cells (Row-Drv) 214A, . . . , 214N may have any number of row driver (Row-Drv) cells including, e.g., a first row driver (Row-Drv) cell 214A and a second (or Nth) row driver (Row-Drv) cell 214N. In various instances, each row driver cell (Row-Drv) 214A, . . . , 214N may include the wordline driver circuitry 114 and the header-clamp circuitry (Hdr-Clp) 118. For instance, the first row driver cell (Row-Drv) 214A may include the wordline driver circuitry 114 and the header-clamp circuitry (Hdr-Clp) 118, and also, the second (or Nth) row driver cell (Row-Drv) 214N may include the wordline driver circuitry 114 and the header-clamp circuitry (Hdr-Clp) 118.

As shown in FIG. 2, each row driver (Row-Drv) cell (214A, . . . , 214N) may include the wordline driver circuitry 114 and the header-clamp (Hdr-Clp) 118 coupled to the power distribution line (PDL) 224, wherein each row driver (Row-Drv) cell (214A, . . . , 214N) has a second set of transistors (e.g., T0, T1 in FIG. 1) coupled between the source voltage (Vdd) and ground (Vss or Gnd), wherein the second set of transistors (T0, T1) may be configured to provide a second internal voltage (another Vddcx) to the power distribution line (PDL) 224 based on the source voltage (Vdd).

In some implementations, in reference to each row driver (Row-Drv) cell (214A, . . . , 214N), the second set of transistors (T0, T1) may refer to second P-type transistors coupled in series between the source voltage (Vdd) and ground (Vss or Gnd), and the second P-type transistors may be configured to provide the second internal voltage (e.g., another Vddcx) to the power distribution line (PDL) 224 via the node (n1), which is disposed between the second P-type transistors. Also, as shown in FIG. 2, the memory architecture 204 may include memory circuitry having one or more arrays of bitcells (210A, ..., 210N), wherein each row driver (Row-Dry) cell (214A, ..., 214N) may have wordline driver circuitry 114 with wordline drivers (e.g., D0, D1) that are coupled to the bitcells (BC) in corresponding array of bitcells (210A, ..., 210N) with wordlines (WL), and wherein the second set of transistors (T0, T1) may be configured to provide the second internal voltage (e.g., another Vddcx) to a power connection of each wordline driver (D0, D1) based on the source voltage (Vdd).

In some instances, as described herein in reference to FIG. 1, each wordline driver circuit (114) shown in FIG. 2 may be coupled to multiple wordlines, such as, e.g., a first wordline (WL0) and a second wordline (WL1), and also, the wordline drivers (D0, D1) may include a first wordline driver (D0) that is coupled to the first wordline (WL0) and a second wordline driver that is coupled to the second wordline (WL1). Moreover, in some instances, as further described herein in reference to FIG. 1, each wordline driver circuit (114) shown in FIG. 2 may include a transistor (T2) coupled between each first wordline (WL0) and each second wordline (WL1), wherein each transistor (T2) may be configured to pass corresponding wordline voltage signals between each first wordline (WL0) and each second wordline (WL1) when activated.

Also, in some instances, the second header cell 218B may be coupled to the power distribution line (PDL) 224, wherein the second header cell 218B has a third set of transistors (e.g., T0, T1 in FIG. 1) that are coupled between the source voltage (Vdd) and ground (Vss or Gnd), and wherein the third set of transistors (T0, T1) are configured to provide a third internal voltage (e.g., another Vddcx) to the power distribution line (PDL) 224 based on the source voltage (Vdd). Moreover, the third set of transistors may include third P-type transistors that are coupled in series between the source voltage (Vdd) and ground (Vss or Gnd), and also, the third P-type transistors may be configured to provide the third internal voltage (e.g., another Vddcx) to the power distribution line (PDL) 224 via the node (n1) that is disposed between the third P-type transistors.

Moreover, in various implementations, the memory architecture 204 may have multiple core strap cells 212A, 212B, including a first core strap cell 212A and a second core strap cell 212B. Also, the memory architecture 204 may have the memory circuitry with a number (N) of bitcell arrays (210A, ..., 210N) that are disposed between the core strap cells 212A, 212B. In some instances, as shown in FIG. 2, the number (N) of bitcell arrays (210A, ..., 210N) may have a first bitcell array 210A and a second (or Nth) bitcell array 210N. However, any number of bitcell arrays be included therein. Also, each bitcell array 210A, ..., 210N may have any number of bitcells (BC) that are arranged in various applicable configurations, such as, e.g., a two-dimensional (2D) memory array having any number (N) of columns (Ncolumns) and any number (N) of rows (Nrows) with the bitcells (BC) arranged in a 2D grid pattern with associated indexing capabilities. Moreover, each bitcell (BC) may be referred to as a memory cell, and each bitcell (BC) may be configured to store a data bit (e.g., a data value related to a logical '0' or '1').

In various applications, the memory architecture 204 may be implemented as an integrated circuit (IC) in using various types of memory, such as, e.g., random access memory (RAM), including static RAM (SRAM), magneto-resistive RAM (MRAM), and/or any other type of similar memory.

The memory architecture 204 may be implemented as an integrated circuit (IC) with dual rail memory architecture and any related circuitry. Also, the memory architecture 204 may be integrated with computing circuitry and other related components on a single chip. Further, the memory architecture 204 may be implemented in various embedded systems for electronic, mobile and IoT applications.

In various implementations, the memory architecture 204 may include volatile or non-volatile memory bitcell structures, such as, e.g., static random access memory (SRAM) bitcell structures or a magneto-resistive random access memory (MRAM) bitcell structures. In some instances, the bitcell structures may be configured with 1T1R MRAM bitcells having one transistor component (1T) and one resistor component (1R). In some instances, the transistor (T) may refer to an N-type MOS (NMOS) transistor, and also, the resistor (R) may refer to a magnetic based resistor having a magnetic tunneling junction (MTJ) interposed between a pinned layer (PL) and a free layer (FL). In reference to MTJ MRAM bitcells, data is stored with magnetic storage elements that are formed from two ferromagnetic plates (PL, FL) separated by a thin insulating layer (MTJ). The pinned layer (PL) may refer to a permanently magnetized plate having a set polarity, and the free layer (FL) may refer to a selectively magnetized plate having a selectively changeable polarity that matches or is opposite to the polarity of the pinned layer (PL). Also, when sensing for resistance, the aligned polarities may provide lower resistance for representing a first readable logical data state, and the opposing polarities may provide higher resistance for a second readable logical data state. As such, a logical zero (0) or a logical one (1) may be stored in the MTJ MRAM bitcell, e.g., based on a sensed resistance level through the MTJ MRAM bitcell. Moreover, for data access, each bitcell may include a wordline (WL), and in MRAM, the bitlines may be implemented with a bitline (BL) and a source line (SL). However, even though MTJ-MRAM bitcell structures may be used in the core bitcell array circuitry 108, any other type of bitcell (e.g., SRAM) may be used to achieve similar results of the sensing schemes and techniques disclosed herein.

Figure 3:
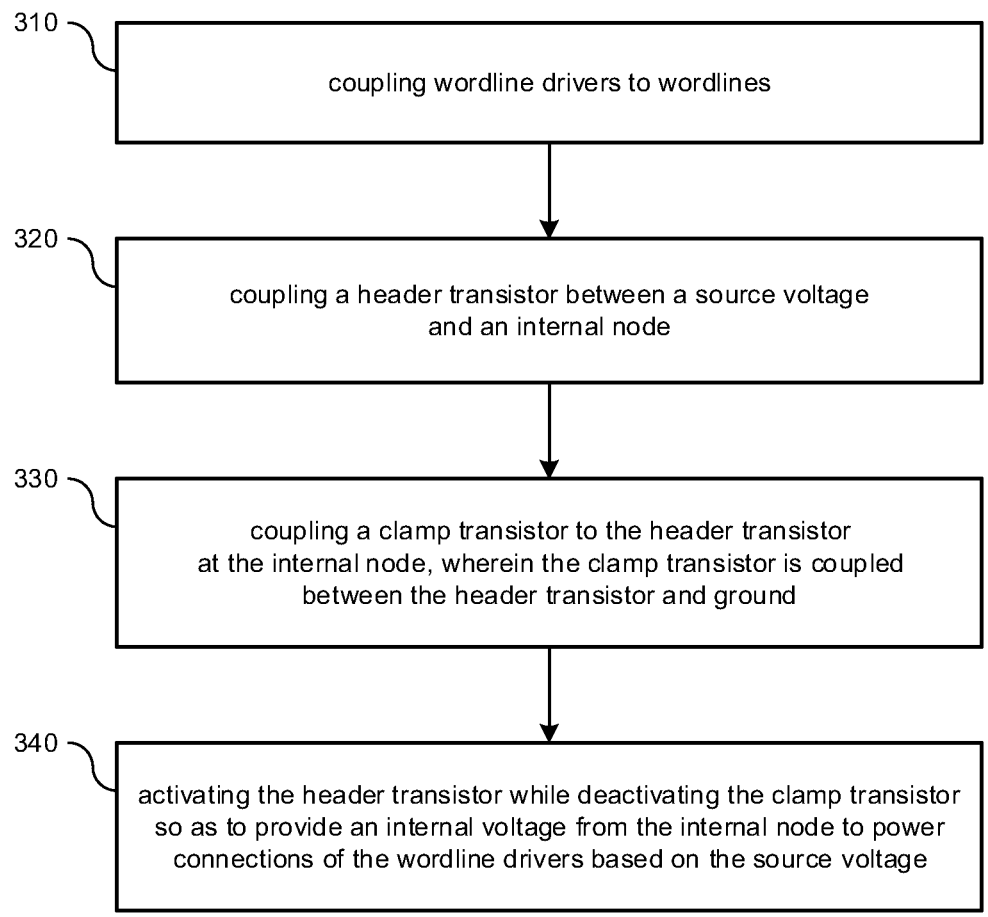
FIG. 3 illustrates a diagram of a method for providing memory architecture in accordance with various implementations described herein.

FIG. 3 illustrates a process diagram of a method 300 for providing memory architecture with header and clamp circuitry in accordance with various implementations described herein.

It should be understood that even though the method 300 indicates a particular order of operation execution, in some cases, various particular portions of the operations may be executed in a different order, and on different systems. In other cases, additional operations and/or steps may be added to and/or omitted from method 300. Also, method 300 may be implemented in hardware and/or software. If implemented in hardware, the method 300 may be implemented with various components and/or circuitry, as described herein in reference to FIGS. 1-2. Also, if implemented in software, the method 300 may be implemented as a program and/or software instruction process configured for providing wordline underdrive schemes and techniques, as described herein. Also, if implemented in software, various instructions associated with implementing method 300 may be stored in memory and/or a database. For instance, various types of computing devices having a processor and memory may be configured to perform method 300.

In various implementations, method 300 may refer to a method of designing, providing, building, fabricating and/or manufacturing an integrated circuit (IC) device that may involve various wordline underdrive schemes and techniques described herein using various components and materials described herein. The integrated circuit (IC) device may be integrated in various computing circuitry and related components on a single chip, and further, the integrated circuit (IC) device may be implemented in embedded systems for various electronic, mobile and/or Internet-of-things (IoT) applications.

At block 310, method 300 may couple wordline drivers to wordlines. At block 320, method 300 may couple a header transistor between a source voltage (Vdd) and an internal node. At block 330, method 300 may couple a clamp transistor to the header transistor at the internal node, wherein the clamp transistor is coupled between the header transistor and ground (Vss or Gnd). In various implementations, the header transistor and the clamp transistor may include P-type transistors that are coupled in series between the source voltage (Vdd) and ground (Vss or Gnd). Moreover, at block 340, method 300 may activate the header transistor while deactivating the clamp transistor so as to provide an internal voltage from the internal node to power connections of the wordline drivers based on the source voltage (Vdd).

In some implementations, method 300 may also couple at least one transistor between the wordlines, and method 300 may activate the transistor so as to pass wordline voltage signals between the wordlines. In some implementations, method 300 may also route one or more buried conductive lines (by way of a backside power network) between the internal node and the power connections of the wordline drivers.

Figure 4:
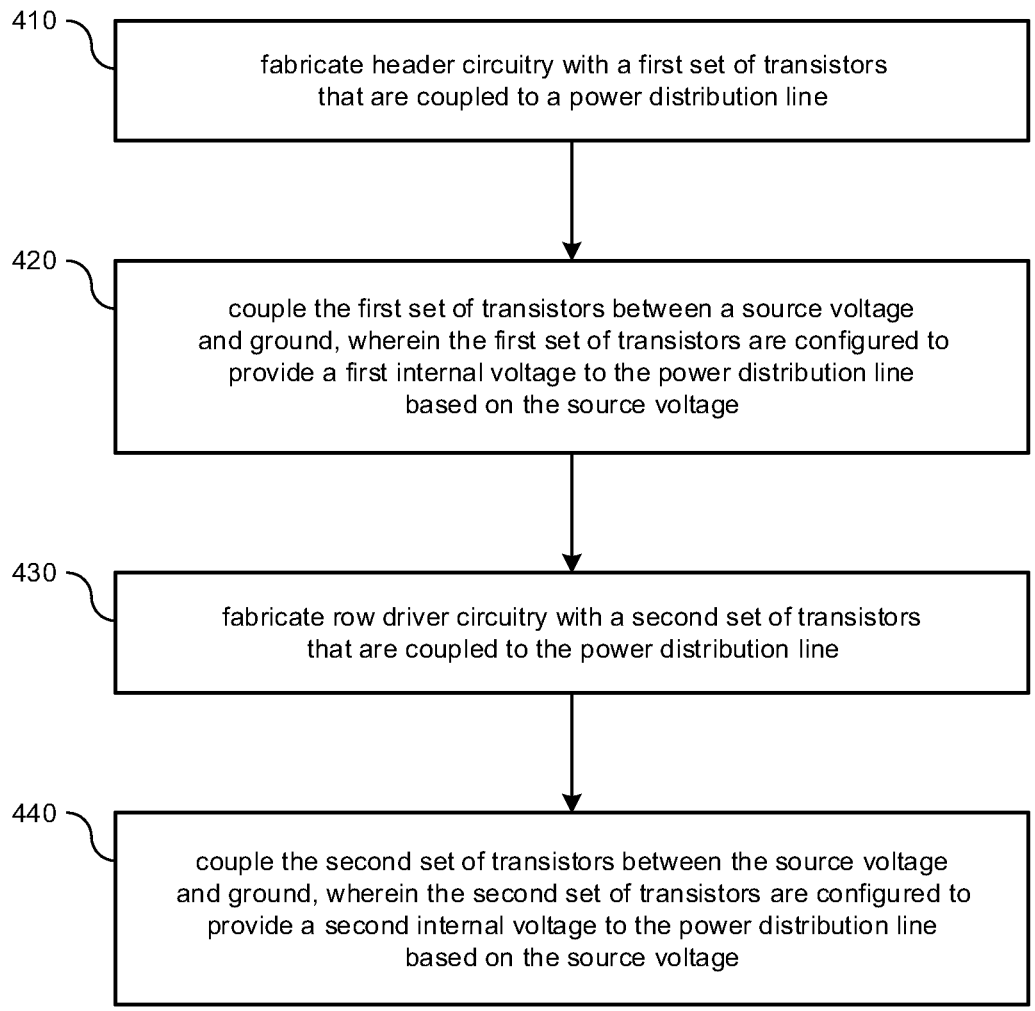
FIG. 4 illustrates a diagram of a method for providing memory architecture with distributed header and clamp circuitry in accordance with various implementations described herein.

FIG. 4 illustrates a process diagram of a method 400 for providing memory architecture along with distributed header and clamp circuitry in accordance with various implementations described herein.

It should be understood that even though the method 400 indicates a particular order of operation execution, in some cases, various particular portions of the operations may be executed in a different order, and on different systems. In other cases, additional operations and/or steps may be added to and/or omitted from method 400. Also, method 400 may be implemented in hardware and/or software. If implemented in hardware, the method 400 may be implemented with various components and/or circuitry, as described herein in reference to FIGS. 1-3. Also, if implemented in software, the method 400 may be implemented as a program and/or software instruction process configured for providing distributed wordline underdrive techniques, as described herein. Also, if implemented in software, various instructions associated with implementing method 400 may be stored in memory and/or a database. For instance, various types of computing devices having a processor and memory may be configured to perform method 400.

In various implementations, method 400 may refer to a method of designing, providing, building, fabricating and/or manufacturing an integrated circuit (IC) device that may involve distributed wordline underdrive techniques described herein using various components and materials described herein. Also, the integrated circuit (IC) device may be integrated in various computing circuitry and related components on a single chip, and further, the integrated circuit (IC) device may be implemented in embedded systems for various electronic, mobile and/or Internet-of-things (IoT) applications.

At block 410, method 400 may fabricate header circuitry along with a first set of transistors that are coupled to a power distribution line. At block 420, method 400 may couple the first set of transistors between a source voltage and ground, and the first set of transistors are configured to provide a first internal voltage to the power distribution line based on the source voltage. At block 430, method 400 may fabricate row driver circuitry with a second set of transistors that are coupled to the power distribution line. At block 440, method 400 may couple the second set of transistors between the source voltage and ground, and the second set of transistors are configured to provide a second internal voltage to the power distribution line based on the source voltage.

In some implementations, the first set of transistors may include first P-type transistors that are coupled in series between the source voltage and ground, and the first P-type transistors may be configured to provide the first internal voltage to the power distribution line via a node disposed between the first P-type transistors. Also, the second set of transistors may include second P-type transistors that are coupled in series between the source voltage and ground, and the second P-type transistors may be configured to provide the second internal voltage to the power distribution line via a node disposed between the second P-type transistors.

In some implementations, method 400 may be used to provide memory circuitry having an array of bitcells, wherein the row driver circuitry may include wordline drivers that are coupled to bitcells in the array of bitcells with wordlines, and wherein the second set of transistors may be configured to provide the second internal voltage to a power connection of each wordline driver based on the source voltage. Also, the wordlines may include a first wordline and a second wordline, and the wordline drivers may include a first wordline driver coupled to the first wordline and a second wordline driver coupled to the second wordline. Also, method 400 may be used to couple a transistor between the first wordline and the second wordline, wherein the transistor passes wordline voltage signals between the first wordline and the second wordline when activated.

In some implementations, the header circuitry may refer to first header circuitry and second header circuitry, and the second header circuitry may be coupled to the power distribution line. Also, the second header circuitry may include a third set of transistors that are coupled between the source voltage and ground, and the third set of transistors may be configured to provide a third internal voltage to the power distribution line based on the source voltage. Also, the third set of transistors may include third P-type transistors that are coupled in series between the source voltage and ground, and the third P-type transistors may be configured to provide the third internal voltage to the power distribution line via a node disposed between the third P-type transistors.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are implementations of a device. The device may have first circuitry with wordline drivers coupled to wordlines. The device may have second circuitry with switch structures coupled between a first voltage and ground. The switch structures may be configured to provide a second voltage to a power connection of each wordline driver based on the first voltage.

Described herein are implementations of a device. The device may have header circuitry coupled to a power distribution line. The header circuitry may have a first set of transistors coupled between a source voltage and ground, and also, the first set of transistors may be configured to provide a first internal voltage to the power distribution line based on the source voltage. The device may have row driver circuitry coupled to the power distribution line. The row driver circuitry may have a second set of transistors coupled between the source voltage and ground, and also, the second set of transistors may be configured to provide a second internal voltage to the power distribution line based on the source voltage.

Described herein are various implementations of a method. The method may couple wordline drivers to wordlines, and the method may couple a header transistor between a source voltage and an internal node. The method may couple a clamp transistor to the header transistor at the internal node, and the clamp transistor may be coupled between the header transistor and ground. The method may activate the header transistor while deactivating the clamp transistor so as to provide an internal voltage from the internal node to power connections of the wordline drivers based on the source voltage.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device comprising:
    first circuitry having wordline drivers coupled to wordlines;
    second circuitry having switch structures that are coupled between a first voltage and ground, wherein the switch structures include a first P-type transistor and a second P-type transistor, and wherein the switch structures are configured to provide a second voltage to a power connection of each wordline driver based on the first voltage; and
    a transistor coupled between the wordlines, wherein the transistor passes wordline voltage signals between the wordlines when activated.

2. The device of claim 1, wherein the P-type transistors are coupled in series between the first voltage and ground.

3. The device of claim 1, wherein the first voltage refers to a source supply voltage, and wherein the second voltage refers to an internal supply voltage.

4. A device comprising:
    first circuitry having wordline drivers coupled to wordlines; and
    second circuitry having switch structures that are coupled between a first voltage and ground, wherein the switch structures are configured to provide a second voltage to a power connection of each wordline driver based on the first voltage,
    wherein the first circuitry refers to driver circuitry,
    wherein the wordlines include a first wordline and a second wordline, and
    wherein the wordline drivers include a first wordline driver coupled to the first wordline and a second wordline driver coupled to the second wordline.

5. The device of claim 4, further comprising:
    a transistor coupled between the first wordline and the second wordline,
    wherein the transistor passes wordline voltage signals between the first wordline and the second wordline when activated.

6. A device comprising:
first circuitry having wordline drivers coupled to wordlines; and
second circuitry having switch structures that are coupled between a first voltage and ground, wherein the switch structures are configured to provide a second voltage to a power connection of each wordline driver based on the first voltage,
wherein the second circuitry refers to header-clamp circuitry,
wherein the switch structures include a first P-type transistor and a second P-type transistor,
wherein the first P-type transistor is coupled between the first voltage and the second P-type transistor so as to operate as a header, and
wherein the second P-type transistor is coupled between the first P-type transistor and ground so as to operate as a clamp.

7. The device of claim 6, wherein:
the first P-type transistor is coupled to the second P-type transistor at an output node of the second circuitry, and
the output node provides the second voltage to the power connection of each wordline driver when the first P-type transistor is activated and when the second P-type transistor is deactivated.

8. The device of claim 7, further comprising:
one or more buried conductive lines that are routed between the output node of the second circuitry and the power connections of the wordline drivers.

9. A device comprising:
header circuitry coupled to a power distribution line, wherein the header circuitry has a first set of transistors coupled between a source voltage and ground, wherein the first set of transistors are configured to provide a first internal voltage to the power distribution line based on the source voltage; and
row driver circuitry coupled to the power distribution line, wherein the row driver circuitry has a second set of transistors coupled between the source voltage and ground, wherein the second set of transistors are configured to provide a second internal voltage to the power distribution line based on the source voltage,
wherein the row driver circuitry has wordline drivers coupled to bitcells in an array of bitcells with wordlines, and wherein the wordlines include a first wordline and a second wordline, and wherein the wordline drivers include a first wordline driver coupled to the first wordline and a second wordline driver coupled to the second wordline.

10. The device of claim 9, wherein:
the first set of transistors has first P-type transistors that are coupled in series between the source voltage and ground, and
the first P-type transistors are configured to provide the first internal voltage to the power distribution line via a node disposed between the first P-type transistors.

11. The device of claim 9, wherein:
the second set of transistors has second P-type transistors that are coupled in series between the source voltage and ground, and
the second P-type transistors are configured to provide the second internal voltage to the power distribution line via a node disposed between the second P-type transistors.

12. The device of claim 9, further comprising:
memory circuitry having an array of bitcells,
wherein the row driver circuitry has wordline drivers coupled to bitcells in the array of bitcells with wordlines, and
wherein the second set of transistors are configured to provide the second internal voltage to a power connection of each wordline driver based on the source voltage.

13. A device comprising:
header circuitry coupled to a power distribution line, wherein the header circuitry has a first set of transistors coupled between a source voltage and ground, wherein the first set of transistors are configured to provide a first internal voltage to the power distribution line based on the source voltage;
row driver circuitry coupled to the power distribution line, wherein the row driver circuitry has a second set of transistors coupled between the source voltage and ground, wherein the second set of transistors are configured to provide a second internal voltage to the power distribution line based on the source voltage; and
memory circuitry having an array of bitcells,
wherein the row driver circuitry has wordline drivers coupled to bitcells in the array of bitcells with wordlines,
wherein the second set of transistors are configured to provide the second internal voltage to a power connection of each wordline driver based on the source voltage,
wherein the wordlines include a first wordline and a second wordline, and
wherein the wordline drivers include a first wordline driver coupled to the first wordline and a second wordline driver coupled to the second wordline.

14. The device of claim 13, further comprising:
a transistor coupled between the first wordline and the second wordline,
wherein the transistor passes wordline voltage signals between the first wordline and the second wordline when activated.

15. A device comprising:
header circuitry coupled to a power distribution line, wherein the header circuitry has a first set of transistors coupled between a source voltage and ground, wherein the first set of transistors are configured to provide a first internal voltage to the power distribution line based on the source voltage; and
row driver circuitry coupled to the power distribution line, wherein the row driver circuitry has a second set of transistors coupled between the source voltage and ground, wherein the second set of transistors are configured to provide a second internal voltage to the power distribution line based on the source voltage,
wherein the header circuitry refers to first header circuitry and second header circuitry,
wherein the second header circuitry is coupled to the power distribution line,
wherein the second header circuitry has a third set of transistors coupled between the source voltage and ground, and
wherein the third set of transistors are configured to provide a third internal voltage to the power distribution line based on the source voltage.

16. The device of claim 15, wherein:
the third set of transistors has third P-type transistors that are coupled in series between the source voltage and ground, and the third P-type transistors are configured to provide the third internal voltage to the power distribution line via a node disposed between the third P-type transistors.

17. A method comprising:
coupling wordline drivers to wordlines;
coupling a header transistor between a source voltage and an internal node;
coupling a clamp transistor to the header transistor at the internal node, wherein the clamp transistor is coupled between the header transistor and ground;
routing buried conductive lines between the internal node and power connections of the wordline drivers; and
activating the header transistor while deactivating the clamp transistor so as to provide an internal voltage from the internal node to the power connections of the wordline drivers by way of the buried conductive lines based on the source voltage.

18. The method of claim 17, wherein the header transistor and the clamp transistor include P-type transistors that are coupled in series between the source voltage and ground.

19. The method of claim 17, further comprising:
coupling a transistor between the wordlines, and
activating the transistor so as to pass wordline voltage signals between the wordlines.

20. The method of claim 17, wherein:
the wordlines include a first wordline and a second wordline,
the wordline drivers include a first wordline driver coupled to the first wordline and a second wordline driver coupled to the second wordline, and
the switch structures include a first P-type transistor and a second P-type transistor coupled in series between the source voltage and ground.

* * * * *